US012592689B2

(12) United States Patent
Wolfe et al.

(10) Patent No.: US 12,592,689 B2
(45) Date of Patent: Mar. 31, 2026

(54) METHOD, SYSTEM, AND DEVICE FOR SLEEP MODE RECOVERY

(71) Applicant: Texas Instruments Incorporated, Dallas, TX (US)

(72) Inventors: Mark A. Wolfe, Plano, TX (US); Harsh D. Jhaveri, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 251 days.

(21) Appl. No.: 18/462,733

(22) Filed: Sep. 7, 2023

(65) Prior Publication Data

US 2024/0178825 A1     May 30, 2024

Related U.S. Application Data

(60) Provisional application No. 63/385,225, filed on Nov. 29, 2022.

(51) Int. Cl.
| | |
|---|---|
| *H03K 5/14* | (2014.01) |
| *H03K 5/1252* | (2006.01) |
| *H03K 19/003* | (2006.01) |

(52) U.S. Cl.
CPC ............. *H03K 5/14* (2013.01); *H03K 5/1252* (2013.01); *H03K 19/00346* (2013.01)

(58) Field of Classification Search
CPC .. H03K 5/14; H03K 5/00; H03K 5/13; H03K 5/131; H03K 5/133; H03K 5/134; H03K 5/15; H03K 5/1252; H03K 5/393; H03K 5/394; H03K 5/395; H03K 5/396; H03K 5/397; H03K 5/398; H03K 5/399; H03K 19/00; H03K 19/003; H03K 19/00369
USPC ....... 327/365, 369, 392, 393, 394, 395, 396, 327/397, 398, 399, 370, 374, 376, 377, 327/379, 384
See application file for complete search history.

(56) References Cited

U.S. PATENT DOCUMENTS

| | | | | |
|---|---|---|---|---|
| 7,382,117 B2 * | 6/2008 | Suda | ...................... | H03K 5/133 |
| | | | | 324/750.01 |
| 12,095,467 B2 * | 9/2024 | Meruva | ................. | H03L 7/0816 |

* cited by examiner

*Primary Examiner* — Hai L Nguyen
(74) *Attorney, Agent, or Firm* — Michael T. Gabrik; Frank D. Cimino

(57) ABSTRACT

A circuit including a device including a receiver having a receiver input, a receiver output, and a bias current input and a bias generator having a bias current output coupled to the bias current input. The device also includes a buffer having a buffer input, an enable input, and a buffer output, the buffer input coupled to the receiver output and a delay circuit having a delay output coupled to the enable input.

20 Claims, 9 Drawing Sheets

METHOD, SYSTEM, AND DEVICE FOR SLEEP MODE RECOVERY

CROSS-REFERENCE TO RELATED APPLICATION

This application claims priority to U.S. Provisional Patent Application No. 63/385,225, filed on Nov. 29, 2022, and entitled "Method of Glitch Suppression in DLP System Caused by HiZ States During Sleep Modes," which application is hereby incorporated herein by reference in its entirety.

TECHNICAL FIELD

The present application relates in general to electronic circuitry, and, in particular, to a method and apparatus for a method, system, and device for sleep mode recovery.

BACKGROUND

In many applications, for example projection applications, it is desirable to have multiple sleep levels to save power. When waking up from a deeper sleep level in which a receiver clock is turned off, glitches can occur. It is desirable to wake from a sleep mode in which a receiver clock is turned on quickly without glitches.

SUMMARY

An embodiment includes a circuit including a device including a receiver having a receiver input, a receiver output, and a bias current input and a bias generator having a bias current output coupled to the bias current input. The device also includes a buffer having a buffer input, an enable input, and a buffer output, the buffer input coupled to the receiver output and a delay circuit having a delay output coupled to the enable input.

An embodiment includes a system including a controller including a transmitter having a transmitter output and a device coupled to the controller. The device includes a receiver having a receiver input, a bias current input, and a receiver output, the receiver input coupled to the transmitter output and a bias generator having a bias current output coupled to the bias current input. The bias generator includes a quick turn on circuit and a capacitor coupled to the quick turn on circuit and to the bias current output. The bias generator also includes a time control circuit coupled to the quick turn on circuit. The time control circuit is configured to in response to receiving a system enable signal, instruct the quick turn on circuit to turn on to charge the capacitor and a time period after receiving the system enable signal, instruct the quick turn on circuit to turn off.

An embodiment includes a circuit including a buffer having a buffer input, a buffer output, and an enable input and a delay circuit having a delay output coupled to the enable input. The delay circuit includes a timer coupled to the delay output. The timer is configured to in response to receiving a system enable signal, produce a buffer enable signal having a first value the delay output and a time period after receiving the system enable signal, produce the buffer enable signal having a second value at the delay output, the second value different than the first value.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

Figure 1A:
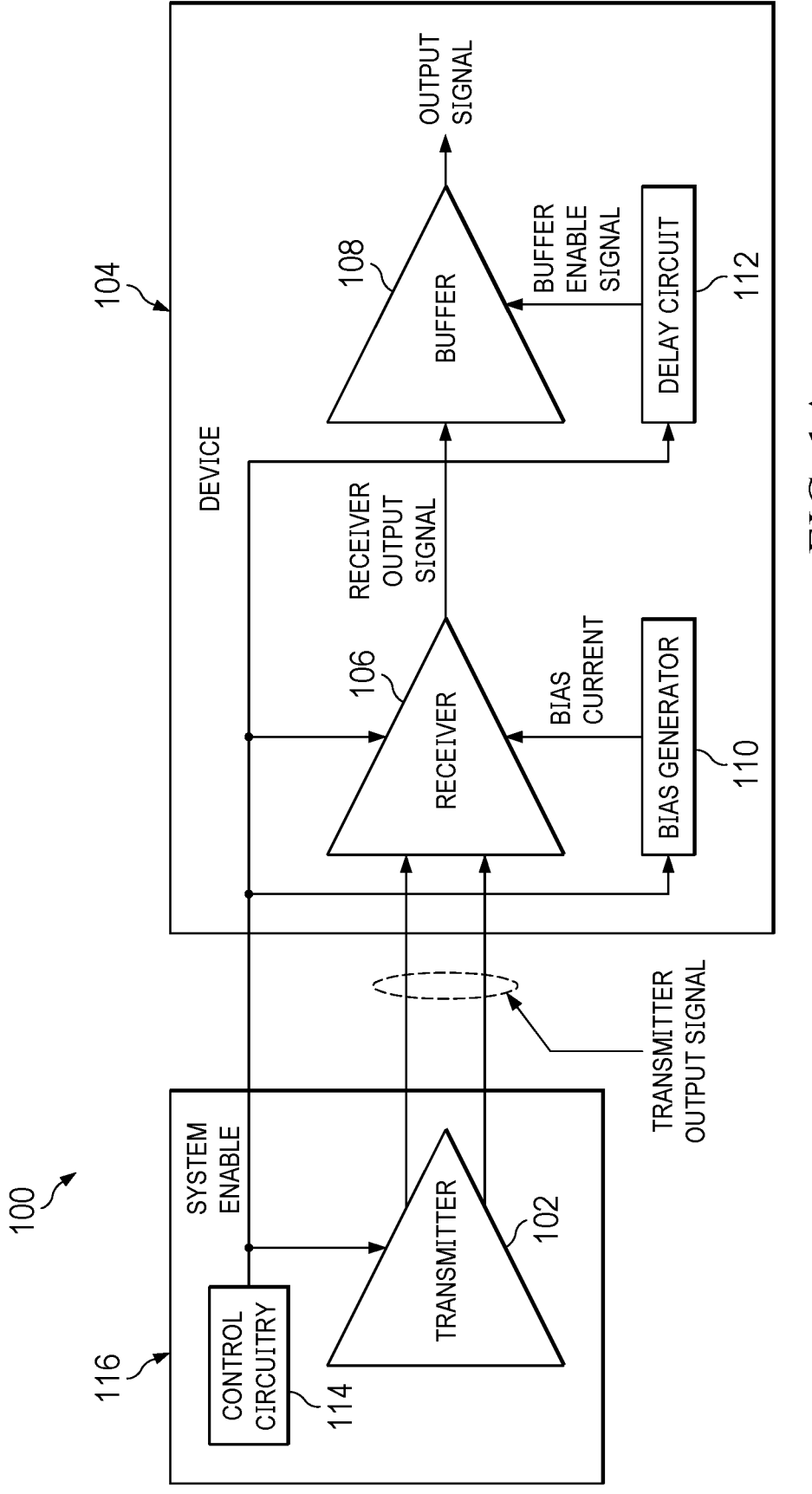
FIG. 1A and FIG. 1B illustrate example systems for communicating data and clock.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

DETAILED DESCRIPTION

Although the example illustrative arrangements have been described in detail, it should be understood that various changes, substitutions and alterations can be made herein without departing from the spirit and scope of the present application as defined by the appended claims.

An example system includes a transmitter coupled to a receiver. The receiver is coupled to a bias generator. The bias generator turns on the receiver quickly by rapidly ramping up the bias current initially in response to receiving a system enable signal by turning on a quick turn on circuit in the bias generator. The bias generator stabilizes the bias current as the bias current settles. An example system also includes a buffer coupled to the receiver and a delay circuit coupled to the buffer. The delay circuit, which may be a timer, such as an analog RC timer, prevents the clock and data received by the receiver from being output by the buffer until the timer expires. For example, the buffer may hold all output signals low until the timer expires. For example, the delay circuit may produce a buffer enable signal having a first value in response to receiving a system enable signal, disabling the buffer. A time period after receiving the system enable signal, the delay circuit produces a buffer enable signal having a second value different than the first value, enabling the buffer. In an example, the time period expires after the bias generator turns off the quick turn on circuit. Example circuits have better noise immunity to glitches, which enable the use of multiple sleep modes, including ultralow power sleep modes. Accordingly, example circuits enable system power reduction, which is important for applications such as augmented reality (AR).

Figure 1B:
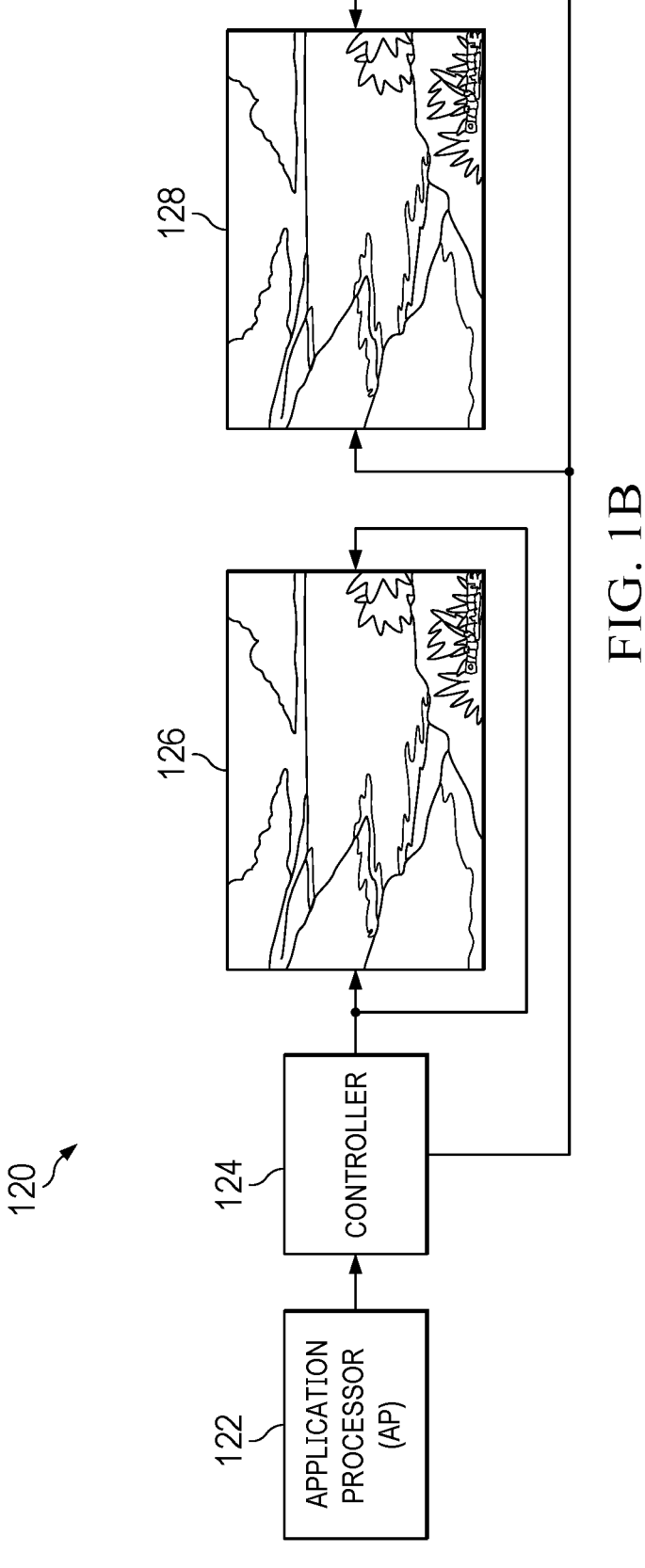

FIGS. 1A-B illustrate example systems for communicating data. FIG. 1A illustrates a system 100 for communicating data. The system 100 contains a controller 116 coupled to a device 104. The system 100 is a circuit. The controller 116 includes control circuitry 114 coupled to a transmitter 102 The device 104 includes a receiver 106 coupled to the transmitter 102 and to the control circuitry 114, a bias generator 110 coupled to the receiver 106 and to the control circuitry 114, a buffer 108 coupled to the receiver 106, and a delay circuit 112 coupled to the buffer 108 and to the control circuitry 114. In an example, the device 104 is a spatial light modulator (SLM) for image projection and the controller 116 is for controlling the SLM. The SLM may be a digital micromirror device (DMD), a liquid crystal on silicon (LCoS) device, a liquid crystal display (LCD) device, a micro light emitting diode (microLED) device, or another SLM, such as a phase light modulator (PLM) or a ferroelectric liquid crystal on silicon (FLCoS) device.

The controller 116 contains the control circuitry 114 coupled to the transmitter 102. The control circuitry 114 is also coupled to the receiver 106, to the bias generator 110, to the buffer 108, and to the delay circuit 112. The control circuitry 114 produces a system enable signal. The transmitter 102 is coupled to the receiver 106. The transmitter 102 has an enable input and a transmitter output. The transmitter 102 transmits data and clock signals to the device 104. In an example, the transmitter 102 transmits eight data streams and one clock stream to the receiver 106. In an example, the transmitter 102 is a differential transmitter. The transmitter output of the transmitter 102 is coupled to a receiver input of the receiver 106. The transmitter 102 receives a system enable signal at the enable input from the control circuitry 114, for example when the system 100 wakes from a deep sleep mode. In response to receiving the system enable signal, the transmitter 102 begins transmitting a transmitter output signal at a transmitter output to the device 104, for example to a receiver input of the receiver 106. In an example, the transmitter output signal includes one clock stream and eight data streams. In an example, the transmitter output signal is a differential signal.

The device 104 includes the receiver 106 which has a receiver input coupled to the transmitter output, an enable input coupled to the control circuitry 114, a receiver output, and a bias current input. The receiver input of the receiver 106 is configured to receive the transmitter output signal from the transmitter 102. In response to receiving the system enable signal from the control circuitry 114 at the enable input, the receiver 106 powers up and begins receiving the transmitter output signal at the receiver input. The device 104 also includes the bias generator 110 which has an enable input configured to receive the system enable signal from the control circuitry 114 and a bias current output coupled to the bias current input of the receiver 106. As pictured, the bias generator 110 has a single bias current output. However, in other examples, the bias generator 110 has multiple bias outputs, with each bias output coupled to a different receiver. In an example, the bias generator 110 has nine bias outputs which are respectively coupled to nine receivers. The nine receivers may include eight data receivers and one clock receiver. In response to receiving the system enable signal at the system enable input, the bias generator 110 rapidly ramps up the bias current to rapidly turn on the receiver 106. For example, the bias generator 110 rapidly ramps up a bias current at the bias current output, which is coupled to the bias current input of the receiver 106, by turning on a quick turn on circuit. The bias generator 110 brings the bias current to a stable level, stabilizing the receiver 106 as the receiver 106 approaches full operation. The receiver 106 is configured to produce a receiver output signal at the receiver output based on receiving the transmitter output signal at the receiver input and based on receiving a bias current at the bias current input. The receiver 106 receives the system enable signal at the enable input, and begins turning on in response to receiving the system enable signal. After the receiver 106 is turned on, the receiver 106 produces a receiver output signal at the receiver output based on the transmitter output signal. In an example, the receiver 106 is a differential receiver which receives a differential transmitter output signal and produces a single ended receiver output signal. The bias generator 110 ramping up the current more rapidly in response to receiving the system enable signal enables the receiver 106 to power up more quickly, especially when returning from a low power state, without glitches.

Additionally, the device 104 includes a buffer 108 having a buffer input coupled to the receiver output of the receiver 106, an enable input coupled to the delay circuit 112, and a buffer output. The buffer input is configured to receive the receiver output signal from the receiver output of the receiver 106. The buffer output is coupled to the data path of the application. In an example in which the device 104 is an SLM, the buffer output is coupled to pixels of the SLM. Also, the device 104 includes a delay circuit having a delay output coupled to the enable input of the buffer 108. The delay circuit 112 is configured to produce a buffer enable signal at the delay output. The buffer 108 is configured to produce an output signal at the buffer output based on receiving the receiver output signal at the buffer input, and based on receiving the buffer enable signal at the enable input. The buffer 108 is enabled based on receiving the buffer enable signal at the enable input. When the buffer 108 is enabled, it produces an output signal at the buffer output based on receiving the receiver output signal at the buffer input. When the buffer 108 is not enabled it does not produce an output signal at the buffer output.

The delay circuit 112 has an enable input and a delay output. The delay circuit 112 delays enabling the buffer 108 for a second time period after receiving the system enable signal at the enable input. In response to receiving the system enable signal at the enable input, the delay circuit 112 produces a buffer enable signal having a first value at the delay circuit output which is coupled to the enable input of the buffer 108. The buffer enable signal having the first value disables the buffer 108. In an example, the first value is a 0. Alternatively, the first value is a 1. A time period after receiving the system enable signal, the delay circuit 112 enables the buffer 108. The time period after receiving the system enable signal, the delay circuit 112 produces the buffer enable signal having a second value different than the first value at the delay circuit output, which is coupled to the first enable input of the buffer 108. The buffer enable signal having the second value enables the buffer 108. In an example, the second value is a 1. Alternatively, the second value is a 0. In an example, the delay circuit 112 enables the buffer 108 a period of time after the bias generator 110 turns off the quick turn on circuit. In an example, the second time period is around 200 ns, for example from 170 ns to 210 ns. In one example, the second time period is around 180 ns. In other examples, the second time period may be a different time value, for example 50 ns, 100 ns, 150 ns, or 250 ns. The second time period is sufficient for the transmitter 102 and the receiver 106 to fully power on and stabilize after receiving the system enable signal, enabling the system 100 to turn on quickly. The delay circuit 112 delaying the buffer 108 from producing the output signal reduces the appearance of glitches at the output signal, especially when powering up following a deep sleep state.

FIG. 1B illustrates system 120, which may be an example system for augmented reality (AR), virtual reality (VR), or mixed reality (MR). The system 120 includes a controller 124 coupled to an application processor (AP), to a display device 126, and to a display device 128. The AP 122 transmits data and control signals to the controller 124. The data may be three dimensional (3D) image data for a left image and a right image. The controller 124 may be an example of the controller 116 illustrated in FIG. 1A. The controller 124 contains the control circuitry 114 and the transmitter 102 (illustrated in FIG. 1A). The controller 124 transmits data and control signals to the display device 126 and to the display device 128. The display device 126 and the display device 126 may be examples of the device 104 illustrated in FIG. 1A. In an example, the display device 126 displays a left image in a left eye of a user and the display device 128 displays a right image in a right eye of the user, so that the user experiences a 3D image. In an example, the display device 126 and the display device 128 each contain a receiver 106, a bias generator 110, a buffer 108, and a delay circuit 112 (illustrated in FIG. 1A).

Figure 2:
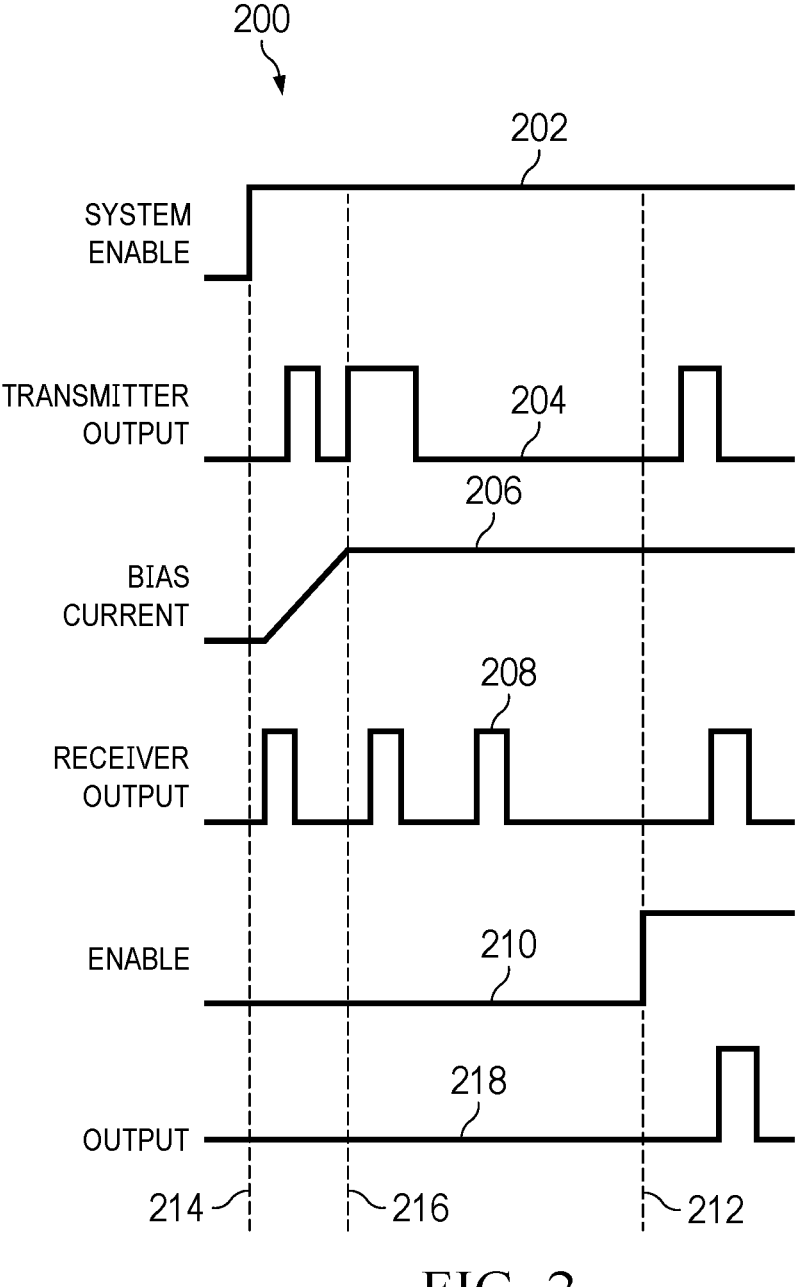
FIG. 2 illustrates timing diagrams for an example system for communicating data and clock.

FIG. 2 illustrates a timing diagram 200 for various signals in the system 100. At time 214, the control circuitry 114 produces the system enable signal 202, which is received at the enable input of the transmitter 102, the enable input of the receiver 106, the enable input of the bias generator 110, and the enable input of the delay circuit 112. In response to receiving the system enable signal 202 at the enable input, the transmitter 102 begins producing a transmitter output signal 204 at the transmitter output. The initial transmitter output signal may contain glitches as the transmitter 102 powers on, for example from a very low power state. In response to receiving the system enable system, the bias generator 110 begins producing the bias current 206. Initially, in response to receiving the system enable signal, the bias generator 110 begins ramping up the bias current 206 by enabling the quick turn on circuit. At time 216, which may be a first time period after the time 214, the bias generator 110 stabilizes the bias current 206 by turning off the quick turn on circuit. Between the time 214 and the time 216, the receiver 106 is unstable. After the time 216, the bias current 206 is approaching stability. Before time 212, the receiver output signal 208 may contain glitches. After time 212, the transmitter 102 is stable and the receiver output signal 208 is follows the transmitter output signal 204. After time 212, the transmitter 102 outputs a signal in the transmitter output signal 204, which is received by the receiver 106 as the receiver output signal 208 and output by the buffer 108 as the output signal 218. The bias generator 110 ramping up the bias current 206 in response to receiving the system enable signal 202 enables the receiver 106 to power up more quickly, especially when returning from a sleep state such as a deep sleep state, without glitches.

In response to receiving the system enable at the enable input, the delay circuit 112 begins a timer and holds the buffer enable signal 210 to a first value, a 0 in the illustrated example. When the buffer enable signal 210 has the first value, the buffer 108 does not produce an output signal, for example by holding the output signal to a particular value, for example 0. At time 212, a second time period after the delay circuit receives the system enable signal, the timer causes the buffer enable signal 210 to transition to a second value different than the first value. In the illustrated example, the second value is a 1. When the buffer 108 receives the second value for the buffer enable signal 210, the buffer 108 produces the receiver output signal received at the buffer input as the output signal at the buffer output. The delay circuit 112 enables the buffer 108 a period of time after the bias generator 110 turns off the quick turn on circuit. In an example, the time period, which is from the time 214 to the time 212, is less than 200 ns, for example from 170 ns to 200 ns. In one example, the time period is 180 ns. In response to the buffer enable signal 210 changing value, the buffer 108 begins producing an output signal 218 at the buffer output based on the receiver output signal 208 at the buffer input. At time 212, the system 100 is fully turned on and ready to transmit and receive signals. The delay circuit 112 delaying the buffer 108 from producing the output signal 218 reduces the appearance of glitches in the output signal 218, especially when powering up following sleep state, for example a deep sleep state.

Figure 3A:
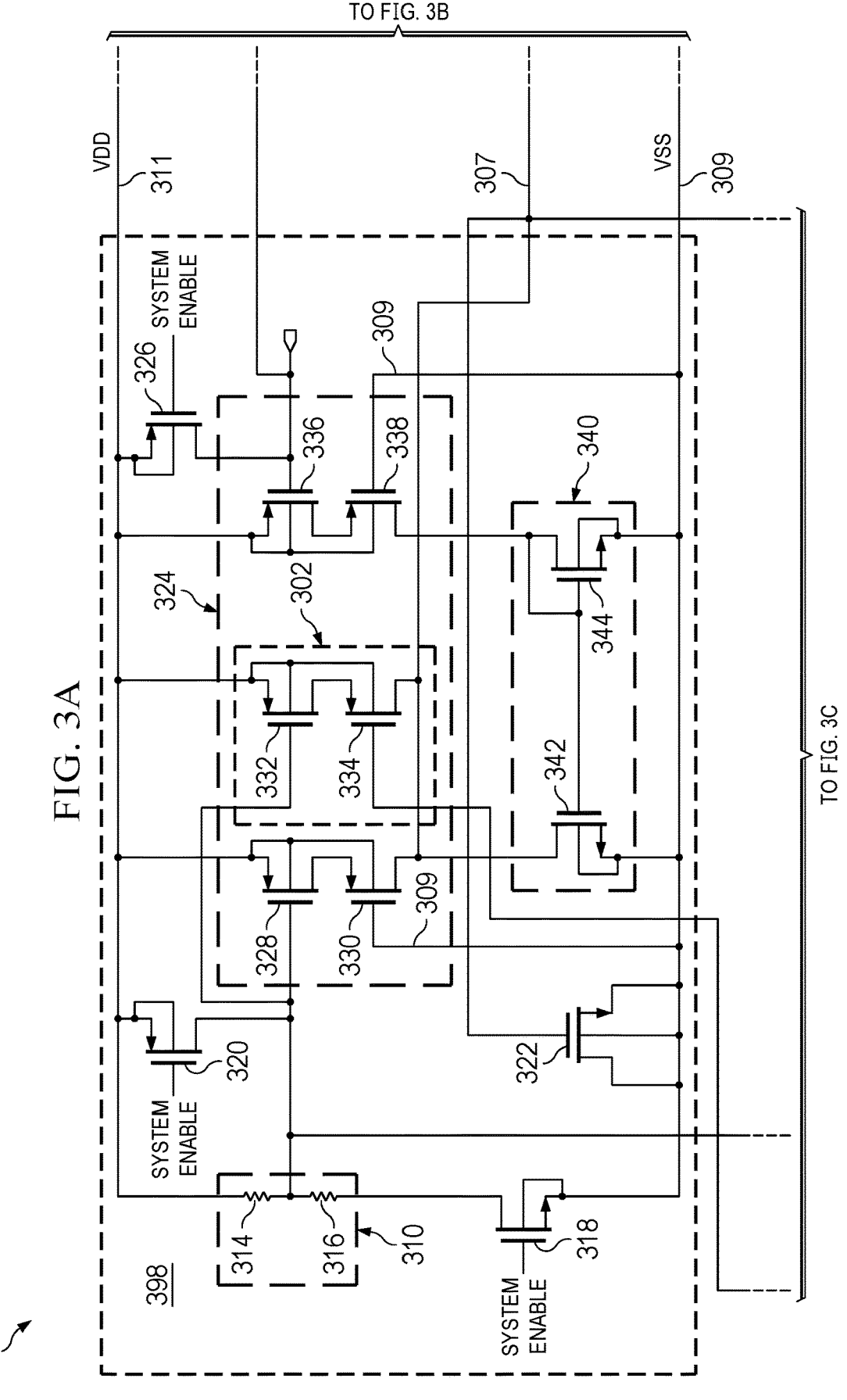
FIGS. 3A-3C illustrate an example circuit with a bias generator.
Figure 3B:
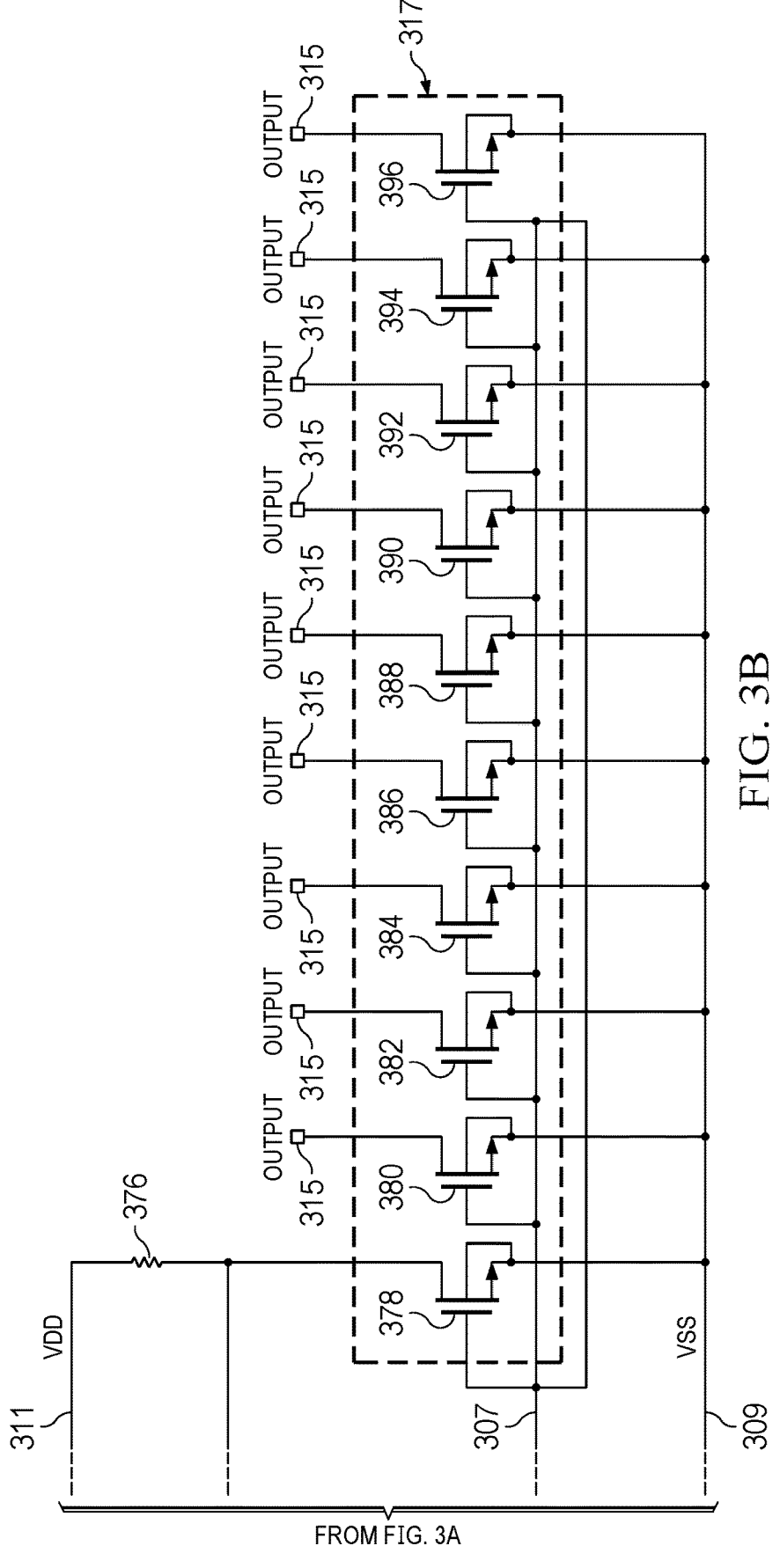
Figure 3C:
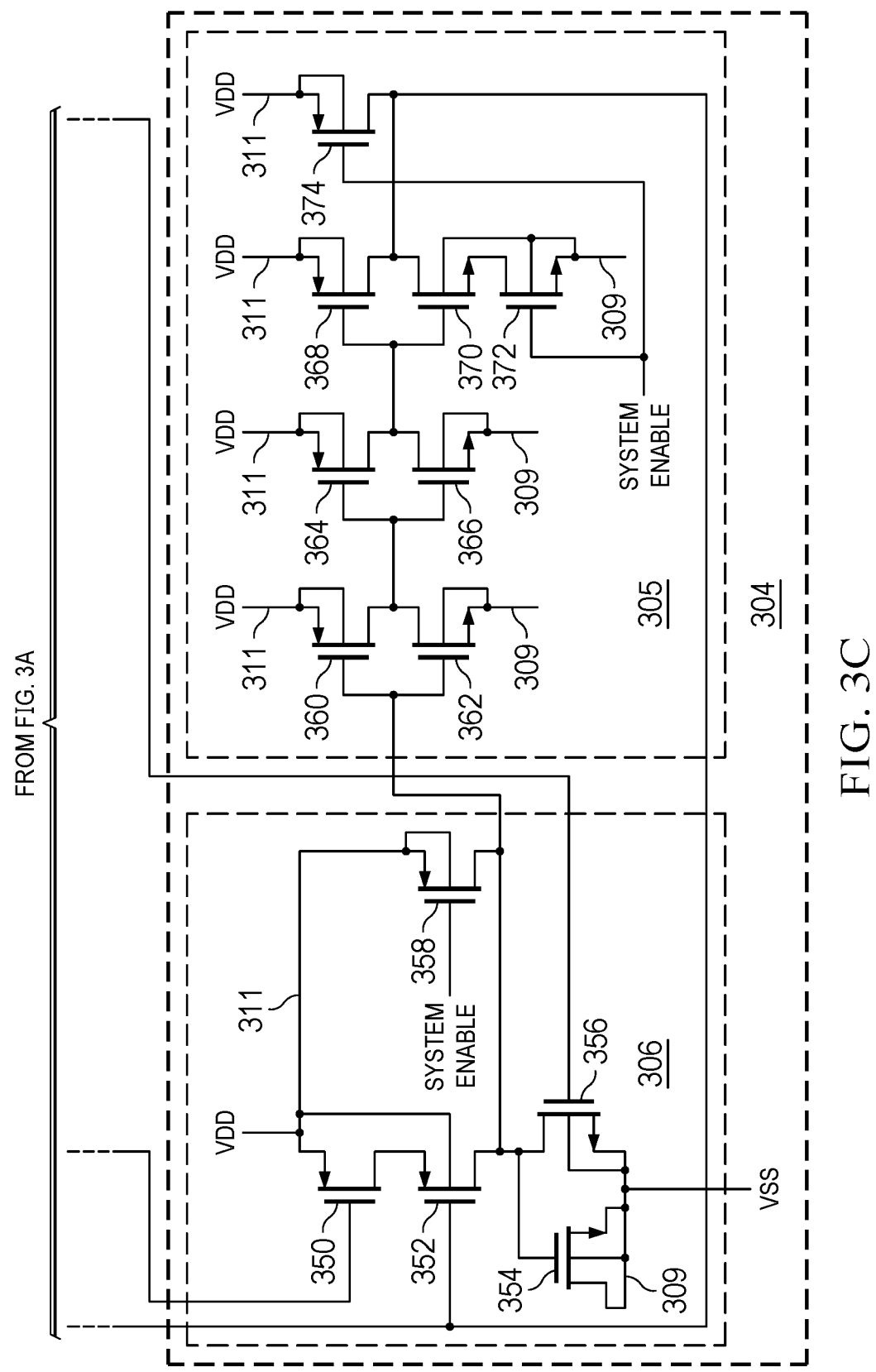

FIGS. 3A-3C illustrate a bias generator 300. The bias generator 300 may be an example of the bias generator 110 illustrated in FIG. 1A. The bias generator 300 receives the system enable signal from the control circuitry 114. The bias generator 300 contains a current generation circuit 398 coupled to a control circuit 304, coupled to the current mirror 317, and coupled to the resistor 376.

The control circuit 304 is a quick turn on control circuit which determines when a quick turn on circuit 302 of the current generation circuit 398 is turned on and when the quick turn on circuit 302 is turned off. The control circuit 304 controls an amount of bias current generated by the quick turn on circuit 302 at the node 307 for the current mirrors 317. The node 307 is coupled to a bias current input of the current mirrors 317. The control circuit 304 includes a time control circuit 306 coupled a comparator and controller 305. The comparator and controller 305 determines whether the quick turn on circuit 302 is on or off. In particular, the comparator and controller 305 turns on and off the transistor 352 in the time control circuit 306 and the transistor 334 in the current generation circuit 398.

The current generation circuit 398 produces a bias current for the current mirrors 317 at the node 307. The current generation circuit 398 contains input differential pairs 324 coupled to voltage divider 310, a current mirror 340, a transistor 320, a transistor 318, a transistor 326, and a capacitor 322. The input differential pairs 324 includes the quick turn on circuit 302 which is turned on in response to receiving the system enable signal and turned off a first time period after receiving the system enable signal by the comparator and controller 305. The time control circuit 306 is coupled to the quick turn on circuit 302. The capacitor 322 is a transistor configured as a capacitor with a first current terminal, a second current terminal, and a body terminal coupled to a ground terminal 309. A first terminal of the capacitor 322 is coupled to the quick turn on circuit 302 and a second terminal of the capacitor 322 is coupled to the ground terminal 309. The time control circuit 306 of the control circuit 304 causes the quick turn on circuit 302 to produce additional current at the node 307 in response to receiving the system enable signal from the control circuitry 114, and additional current is stored in the capacitor 322. The first time period after receiving the system enable signal, the time control circuit 306 turns off the quick turn on circuit 302 based on the voltage across the resistor 376. Other portions of the input differential pairs 324 remain active.

The current mirror 340 contains a transistor 342 coupled to a transistor 344. The transistor 342 has a first current terminal, a second current terminal coupled to the ground terminal 309, a body terminal coupled to the ground terminal 309, and a control terminal. The transistor 344 has a first current terminal coupled to a control terminal of the transistor 344 and to the control terminal of the transistor 342. The transistor 344 also has a second control current terminal coupled to the ground terminal 309 and a body terminal coupled to the ground terminal 309. The current mirror 340 is coupled between the current generation circuit 398 and to the ground terminal 309.

The voltage divider 310 contains a resistor 314 and a resistor 316. The resistor 314 is coupled to the input differential pairs 324, to the control circuit 304, and to a supply voltage terminal 311. The resistor 316 is coupled to the input differential pairs 324, to the control circuit 304, and to the transistor 318. The resistor 314 and the resistor 316 form the voltage divider 310. The voltage at the control terminal of the transistor 328 of the input differential pairs 324 is determined by the voltage divider 310. An amplifier includes input differential pairs 324, the current mirror 340, the transistor 378, and the resistor 376 causes the control terminal of the transistor 336 to have the same voltage as the control terminal of the transistor 328. Accordingly, the voltage across the resistor 376 is based on the resistances of the resistors 314, 316, and 376 and the supply voltage. The current at the transistor 378 is equal to:

$$\left(\frac{R_{314}}{R_{314}+R_{316}}\right)\left(\frac{V_S}{R_{376}}\right),$$

where $R_{314}$ is the resistance of the resistor 314, $R_{316}$ is the resistance of the resistor 316, $R_{376}$ is the resistance of the resistor 376, and Vs is the supply voltage.

The transistor 318 has a first current terminal coupled to the resistor 316, a control terminal configured to receive the system enable signal, a body terminal coupled to the ground terminal 309, and a second current terminal coupled to the ground terminal 309. The transistor 318 turns on or off based on receiving the system enable signal. The transistor 320 has a first current terminal coupled to the supply voltage terminal 311, a body terminal coupled to the supply voltage terminal, a control terminal configured to receive the system enable signal, and a second current terminal coupled between the resistor 314 and the resistor 316. As pictured, the capacitor 322 is a transistor that has a first current terminal coupled to the ground terminal 309, a second current terminal coupled to the ground terminal 309, a body terminal coupled to the ground terminal 309, and a control terminal coupled to the node 307, forming a capacitor. In another example (not pictured) the capacitor 322 is a plate based capacitor. The transistor 326 has a first current terminal coupled to the supply voltage terminal 311, a body terminal coupled to the supply voltage terminal 311, a control terminal configured to receive the system enable signal, and a second current terminal coupled to the input differential pairs 324.

The input differential pairs 324 contains a transistor 328, a transistor 330, a transistor 332, a transistor 334, a transistor 336, and a transistor 338. The transistor 332 and the transistor 334 form the quick turn on circuit 302. The input differential pairs 324, the current mirror 340, the transistor 378, and the resistor 376 cause the current through the resistor 376 to be proportional to the voltage drop across the resistor 314. The transistor 328, the transistor 366, the transistor 342, the transistor 344, and the resistor 376 form a feedback amplifier that forces the voltage across the resistor 376 to match the voltage across the resistor 314. The quick turn on circuit 302 is turned off before the feedback loop settles to prevent the feedback amplifier from becoming unstable and to enable the voltage across the resistor 376 to match the voltage across the resistor 314. The quick turn on circuit 302 temporarily increase the current at the node 307, which is coupled to the capacitor 322, enabling the signal at the node 307 to increase rapidly from ground. The signal at the node 307 controls the current at the current mirrors 317. When the voltage across the resistor stabilizes, the bias current is settled and the current mirrors 317 provides a mirror of the current at node 307 to the receiver amplifiers. Then, the quick turn on circuit 302 is turned off. The transistor 328 has a first current terminal coupled to the supply voltage terminal 311, a body terminal coupled to the supply voltage terminal 311, a control terminal coupled between the resistor 314 and the resistor 316, and a second current terminal. The transistor 320 turns off the transistor 328, based on receiving the system enable signal, by pulling the control terminal of the transistor 328 to supply voltage to turn it off. The transistor 330 has a first current terminal coupled to the second current terminal of the transistor 328, a second current terminal coupled to the node 307, a body terminal coupled to the supply voltage terminal 311, and a control terminal coupled to the ground terminal 309. The transistor 330 is a cascode transistor that increases the output impedance of the transistor 328. The transistor 336 has a first current terminal coupled to the supply voltage terminal 311, a body terminal coupled to the supply voltage terminal 311, a second current terminal, and a control terminal. The transistor 326 turns off the transistor 336, based on receiving the system enable signal, by pulling the control terminal of the transistor 336 to the supply voltage to turn it off. The transistor 338 has a first current terminal coupled to the second current terminal of the transistor 336, a body terminal coupled to the supply voltage terminal 311, a control terminal coupled to the ground terminal 309, and a second current terminal. The transistor 338 is a cascode transistor that increases the output impedance of the transistor 336. The transistor 332 and the transistor 334 form a current source, as the quick turn on circuit 302. The transistor 332 has a first current terminal coupled to the supply voltage terminal 311 and a control terminal coupled to the control terminal of the transistor 328, between the resistor 314 and the resistor 316, and to the time control circuit 306. The transistor 332 also has a body terminal coupled to the supply voltage terminal 311 and a second current terminal. The transistor 334 has a first current terminal coupled to the second transistor of the transistor 332, a body terminal coupled to the supply voltage terminal 311, a control terminal, and a second current terminal coupled to the node 307.

The current mirrors 317 contains a transistor 378, a transistor 380, a transistor 382, a transistor 384, a transistor 386, a transistor 388, a transistor 390, a transistor 392, a transistor 394, and a transistor 396. The transistor 378 is a control transistor. The bias generator 300 controls the current in the transistor 378 so the voltage across the resistor 376 matches the voltage across the resistor 314. The transistor 378 acts as a reference for the current mirrors 317. The transistor 378 has a first current terminal coupled to a supply voltage terminal 311 via a resistor 376. The transistor 378 also has a control terminal coupled to the node 307, which supplies the bias current. The transistor 378 has a second current terminal coupled to the ground terminal 309 and a body terminal coupled to the ground terminal 309. The resistor 376 has a first terminal coupled to the first current terminal of the transistor 378 and a second terminal coupled to the supply voltage terminal 311. The transistor 382, the transistor 384, the transistor 386, the transistor 388, the transistor 390, the transistor 392, the transistor 394, and the transistor 396 each provide a bias current to a separate data or control receiver. Each of the transistors 380-396 has a first current terminal coupled to an output terminals 315 and a control terminal coupled to the node 307. The current mirror 317 provides the bias current at the output terminals, which may be the bias output of the bias generator 300. The transistors 380-396 also have a second current terminal coupled to the ground terminal 309 and a body terminal coupled to the ground terminal 309.

The control circuit 304 contains the time control circuit 306 coupled to the comparator and controller 305. The control circuit 304 is coupled to the input differential pairs 324, in particular to the quick turn on circuit 302, to the voltage divider 310, and to the current mirrors 317. In the time control circuit 306, the transistor 350 is in parallel with the transistor 328 and the transistor 332 in the quick turn on circuit 302. The transistor 350, transistor 328, and transistor 332 act as a current source based on the voltage across the resistor 314. The transistor 356 is parallel with the transistor 378. Initially, the transistor 356 is off. The signal at the node 307 rises from ground as the system tries to make the current through the resistor 376 proportional to the voltage across the resistor 314. As the signal at the node 307 rises, the transistor 356 turns on. When the drive strength of the transistor 356 becomes greater than the current from the transistor 350, the first current terminal of the transistor 356 goes low and trips the comparator and controller 305. The time control circuit 306 is designed so that the comparator and controller 305 trips before the transistor 378 reaches its final current.

The time control circuit 306 contains a transistor 350, a transistor 352, a transistor 358, a capacitor 354, and a transistor 356. The transistor 350 has a first current terminal coupled to a body terminal and to the supply voltage terminal 311. The transistor 350 also has control terminal coupled to the control terminals of transistors 328 and 332 and between the resistor 314 and the resistor 316. The transistor 350 also has a second current terminal. The transistor 352 has a first current terminal coupled to the second current terminal of the transistor 350, a control terminal coupled to the second current terminal of the transistor 374, a body terminal coupled to the supply voltage terminal 311, and a second current terminal. The transistor 358 has a first current terminal coupled to the supply voltage terminal 311, a control terminal configured to receive the system enable signal, a body terminal coupled to the supply voltage terminal, and a second current terminal coupled to the second current terminal of the transistor 352. The transistor 358 is a turn off device. When the system 100 is off, the transistor 358 pulls the voltage of the second current terminal to the voltage of the first current terminal, the supply voltage terminal 311. When the system 100 is on, the voltage at the second current terminal of the transistor 358 remains high until the current in the transistor 356 becomes larger than the current in the transistor 350. The transistor 356 has a first current terminal coupled to the second current terminal of the transistor 352 and to the second current terminal of the transistor 358. The transistor 356 also has a second current terminal coupled to the ground terminal 309, a body terminal coupled to the ground terminal 309, and a control terminal configured to receive the signal at the node 307. In the illustrated example, the capacitor 354 is a transistor that has a first current terminal, a second current terminal, and a body terminal coupled to the ground terminal 309, forming a capacitor. The capacitor 354 also has a control terminal coupled to the second current terminal of the transistor 352, to the second current terminal of the transistor 358, and to the first current terminal of the transistor 356. In another example (not pictured) the capacitor 354 is a plate capacitor.

The comparator and controller 305 contains a transistor 360, a transistor 364, a transistor 362, a transistor 366, a transistor 368, a transistor 374, a transistor 370, and a transistor 372. The transistor 360 and the transistor 362 form an inverter. In some examples (not pictured) the transistor 360 and the transistor 362 are replaced with a Schmitt trigger. The transistor 360 has a first current terminal coupled to the supply voltage terminal 311, a control terminal coupled to the second current terminal of the transistor 352, to the first current terminal of the transistor 356 and to the second current terminal of the transistor 358, a body terminal coupled to the first current terminal, and a second current terminal. The transistor 362 has a first current terminal coupled to the second current terminal of the transistor 360 and a control terminal coupled to the control terminal of the transistor 360. The transistor 362 also has a second current terminal coupled to the body terminal and to the ground terminal 309.

The transistor 364 has a first current terminal coupled to the body terminal and to the supply voltage terminal 311, a control terminal coupled to the second current terminal of the transistor 360 and to the first current terminal of the transistor 362, and a second current terminal. The transistor 366 has a first current terminal coupled to the second current terminal of the transistor 364. The transistor 366 also has a second current terminal coupled to the body terminal and to the ground terminal 309 and a control terminal coupled to the control terminal of the transistor 364. The transistor 368 has a first current terminal coupled to the supply voltage terminal 311, a control terminal coupled to the second current terminal of the transistor 364 and to the first current terminal of the transistor 366, and a second current terminal coupled to the control terminal of the transistor 352. The transistor 374 has a first current terminal coupled to the supply voltage terminal, a control terminal configured to receive the system enable signal, and a second current terminal coupled to the second current terminal of the transistor 368, to the control terminal of the transistor 334, and to the control terminal of the transistor 352. A quick recovery disable signal at the second current terminal of the transistor 374 turns off the transistor 352 and the transistor 334. The transistor 370 has a first current terminal coupled to the second current terminal of the transistor 368. The transistor 370 also has a control terminal coupled to the control terminal of the transistor 368. Additionally, the transistor 370 has a second current terminal and a body terminal coupled to the ground terminal 309. The transistor 372 has a first current terminal coupled to the second current terminal of the transistor 370. The transistor 372 also has a second current terminal coupled to the body terminal, to the body terminal of the transistor 370, and to the ground terminal 309. The transistor 372 also has a control terminal coupled to the control terminal of transistor 374, the control terminal configured to receive the system enable signal.

Figure 4A:
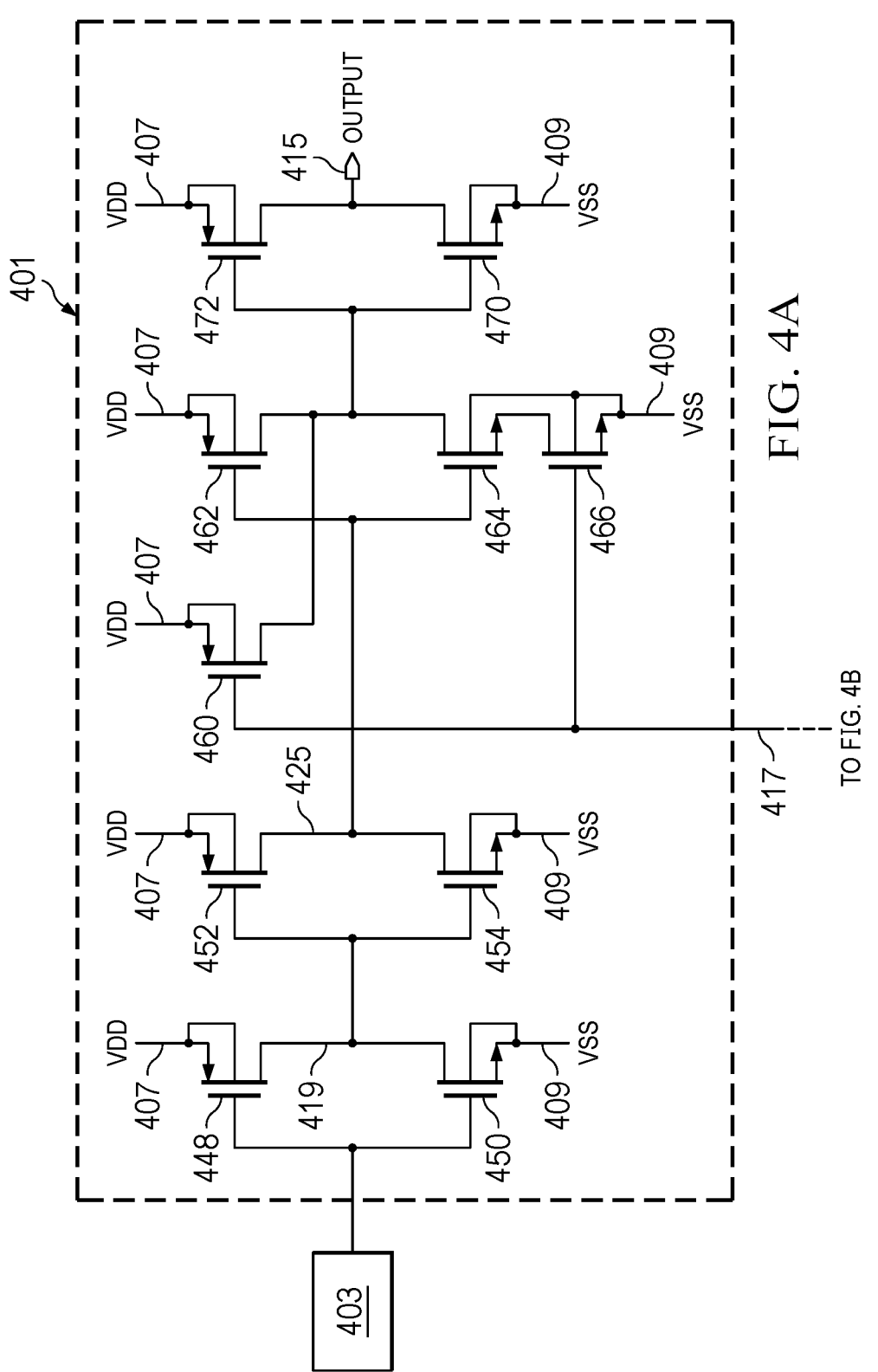
FIGS. 4A-4B illustrate an example circuit with a delay circuit and a buffer.
Figure 4B:
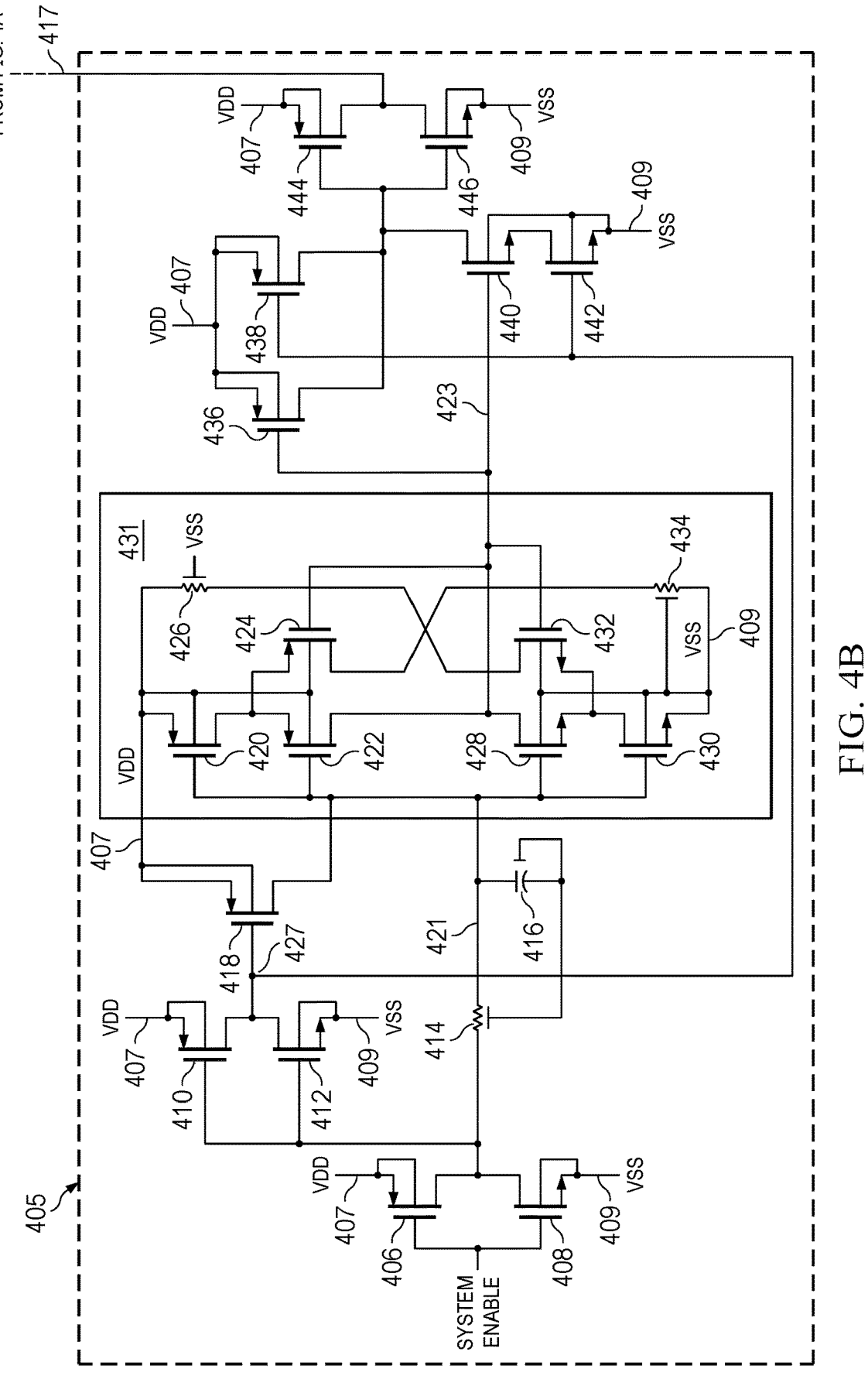

FIGS. 4A-4B illustrate an example delay circuit 405 coupled to a buffer 401, and the buffer 401 is coupled to the receiver 403. The delay circuit 405 may be an example of the delay circuit 112 illustrated in FIG. 1A. The buffer 401 may be an example of the buffer 108 illustrated in FIG. 1A. The receiver 403 may be an example of at least a portion of the receiver 106 illustrated in FIG. 1A.

The buffer 401 either holds an output signal at the buffer output terminal 415 low or outputs a receiver output signal received from the receiver 403 at the buffer output terminal 415 based on a buffer enable signal at the node 417 received from the delay circuit 405. The buffer 401 may be an example of the buffer 108 illustrated in FIG. 1A. The buffer 401 contains a transistor 448, a transistor 450, a transistor 452, a transistor 454, a transistor 460, a transistor 462, a transistor 464, a transistor 466, a transistor 472, and a transistor 470. The transistor 448 has a first current terminal coupled to the supply voltage terminal 407, a body terminal coupled to the supply voltage terminal 407, a second current terminal coupled to a node 419, and a control terminal coupled to the receiver 403, configured to receive the receiver output signal. The transistor 450 has a first current terminal coupled to the second current terminal of the transistor 448 and to the node 419, a second current terminal coupled to the ground terminal 409, a body terminal coupled to the ground terminal 409, and a control terminal coupled to the receiver 403, configured to receive the receiver output signal. The transistor 448 and the transistor 450 are configured to pull the node 419 to the supply voltage or to ground based on the receiver output signal at the receiver output terminal of the receiver 403. The transistor 452 has a first current terminal coupled to the supply voltage terminal 407, a body terminal coupled to the supply voltage terminal 407, a second current terminal coupled to a node 425, and a control terminal coupled to the node 419. The transistor 454 has a first current terminal coupled to the second current terminal of the transistor 452 at the node 425, a second current terminal coupled to a ground terminal 409, a body terminal coupled to the ground terminal 409, and a control terminal coupled to the node 419. The transistor 452 and the transistor 454 set a voltage at the node 425 to either the supply voltage or the ground voltage based on the voltage at the node 419.

The transistor 460 has a first current terminal coupled to the supply voltage terminal 407, a body terminal coupled to the supply voltage terminal 407, a second current terminal, and a control terminal coupled to the node 417 and configured to receive the buffer enable signal from the delay circuit 405. The transistor 462 has a first current terminal coupled to the supply voltage terminal 407, a body terminal coupled to the supply voltage terminal 407, a second current terminal coupled to the second current terminal of the transistor 460, and a control terminal coupled to the node 425. The transistor 464 has a first current terminal coupled to the second current terminal of the transistor 460 and to the second current terminal of the transistor 462, a body terminal coupled to the ground terminal 409, a second current terminal, and a control terminal coupled to the node 425. The transistor 466 has a first current terminal coupled to the second current terminal of the transistor 464, a second current terminal coupled to the ground terminal 409, a body terminal coupled to the ground terminal 409, and a control terminal coupled to the node 417, configured to receive the buffer enable signal from the delay circuit 405. The transistor 472 has a first current terminal coupled to the supply voltage terminal, a body terminal coupled to the supply voltage terminal, a second current terminal coupled to a buffer output terminal 415, and a control terminal coupled to the second current terminal of the transistor 462, to the first current terminal of the transistor 464, and to the second current terminal of the transistor 460. The transistor 470 has a first current terminal coupled to the buffer output terminal 415, a second current terminal coupled to the ground terminal 409, a body terminal coupled to the ground terminal 409, and a control terminal coupled to the second current terminal of the transistor 462, to the first current terminal of the transistor 464, and to the second current terminal of the transistor 460. The transistor 460 and the transistor 466 will, based on the buffer enable signal at the node 417, enable the output signal at the buffer output terminal to be set to the receiver output signal from the receiver 403 or be set to the ground signal.

The delay circuit 405 has a delay output coupled to an enable input of the buffer 401 at node 417. The delay circuit 405 acts as an RC timer that starts when the system 100 is enabled by receiving the system enable signal, with the resistor 414 and the capacitor 416. The delay circuit 405 may be an example of the delay circuit 112 illustrated in FIG. 1A. The delay circuit 405 has a second time period of between 160 ns and 200 ns, which may be between 170 ns and 190 ns, for example 180 ns. In another example, the second time period is a different value, for example about 100 ns. The second time period is designed to be sufficient for the transmitter 102, the receiver 106, and the buffer 108 to stabilize. The delay circuit 405 produces a buffer enable signal at the node 417 that, for the second time period after receiving a system enable signal, produces a delay signal at the node 417 to disable the buffer 401. That is, in response to receiving the system enable signal, the delay circuit 405 produces a delay signal at the delay output having a first value, which is coupled to the enable input of the buffer 401. In an example, the first value is a 0. Alternatively, the first value is a 1. The node 417 is coupled to the delay output of the delay circuit 405 and to the enable input of the buffer 401. A second time period after receiving the system delay signal, the delay circuit 405 produces a delay signal having a second value different than the first value at the node 417, at the delay output, to enable the buffer 401. In an example, the second value is a 1. Alternatively, the second value is a 0. In an example, to prevent glitches, the second time period is greater than the first time period. The transistor 420, the transistor 422, the transistor 428, the transistor 430, the transistor 432, the transistor 424, the resistor 426, and the resistor 434 form a Schmitt trigger 431.

The transistor 406 has a first current terminal coupled to the supply voltage terminal 407, a body terminal coupled to the supply voltage terminal 407, a second current terminal, and a control terminal configured to receive the system enable signal. The transistor 408 has a first current terminal coupled to the second current terminal of the transistor 406, a second current terminal coupled to the ground terminal 409, a body terminal coupled to the ground terminal 409, and a control terminal coupled to the control terminal of the transistor 406, and configured to receive the system enable signal. The resistor 414 has a first terminal coupled to the second current terminal of the transistor 406 and to the first current terminal of the transistor 408 and a second terminal coupled to a node 421. The capacitor 416 has a first terminal coupled to the node 42 and a second terminal coupled to the ground terminal 409. The transistor 410 has a first current terminal coupled to the supply voltage terminal 407, a body terminal coupled to the supply voltage terminal 407, a second current terminal coupled to a node 427, and a control terminal coupled to the second current terminal of the transistor 406 and the first current terminal of the transistor 408. The transistor 412 has a first current terminal coupled to the second current terminal of the transistor 410, at the node 427, a second current terminal coupled to the ground terminal 409, a body terminal coupled to the ground terminal 409, and a control terminal coupled to the second current terminal of the transistor 406, to the first current terminal of the transistor 408, and to the control terminal of the transistor 410. The transistor 418 has a first current terminal coupled to the supply voltage terminal 407, a body terminal coupled to the supply voltage terminal 407, a second current terminal coupled to the node 421, and a control terminal coupled to the node 427, to the second current terminal of the transistor 410, and to the first current terminal of the transistor 412.

The Schmitt trigger 431 includes the transistor 420, the transistor 422, the transistor 424, the resistor 426, the transistor 428, the transistor 432, the transistor 430, and the resistor 434. In other examples (not pictured) the Schmitt trigger 431 has a different configuration. For example, the Schmitt trigger 431 may include the transistor 420, the transistor 422, the transistor 428, the transistor 432, and the transistor 430, and it does not include the resistor 426 and the resistor 434. The transistor 420 has a first current terminal coupled to the supply voltage terminal 407, a body terminal coupled to the supply voltage terminal 407, a second current terminal, and a control terminal coupled to the node 421. The transistor 422 has a first current terminal coupled to the second current terminal of the transistor 420, a body terminal coupled to the supply voltage terminal 407, a second current terminal coupled to the node 423, and a control terminal coupled to the node 421. The transistor 424 has a first current terminal coupled to the second current terminal of the transistor 420 and to the first current terminal of the transistor 422, a body terminal coupled to the supply voltage terminal 407, a second current terminal, and a control terminal coupled to the node 423. The resistor 426 has a first terminal coupled to the supply voltage terminal 407 and a second terminal. The transistor 428 has a first current terminal coupled to the node 423, a body terminal coupled to the ground terminal 409, a second current terminal, and a control terminal coupled to the node 421. The transistor 430 has a first current terminal coupled to the second current terminal of the transistor 428, a second current terminal coupled to the ground terminal 409, a body terminal coupled to the ground terminal 409, and a control terminal coupled to the node 421. The transistor 432 has a first current terminal coupled to the second terminal of the resistor 426, a second current terminal coupled to the second current terminal of the transistor 428 and to the first current terminal of the transistor 430, a body terminal coupled to the ground terminal 409, and a control terminal coupled to the node 423. The resistor 434 has a first terminal coupled to the second current terminal of the transistor 424 and a second terminal coupled to the ground terminal 409.

The transistor 436 has a first current terminal coupled to the supply voltage terminal 407, a body terminal coupled to the supply voltage terminal 407, a second current terminal, and a control terminal coupled to the node 423. The transistor 440 has a first current terminal coupled to the second current terminal of the transistor 436, a second current terminal, a body terminal coupled to the ground terminal 409, and a control terminal coupled to the node 423. The transistor 442 has a first current terminal coupled to the second current terminal of the transistor 440, a second current terminal coupled to the ground terminal 409, a body terminal coupled to the ground terminal 409, and a control terminal coupled to the node 423. The transistor 438 has a first current terminal coupled to the supply voltage terminal 407, a body terminal coupled to the supply voltage terminal 407, a second current terminal coupled to the second current terminal of the transistor 436 and to the first current terminal of the transistor 440, and a control terminal coupled to the node 423. The transistor 444 has a first current terminal coupled to the supply voltage terminal 407, a body terminal coupled to the supply voltage terminal 407, a second current terminal coupled to the node 417, and a control terminal coupled to the second terminal of the transistor 438. The transistor 446 has a first current terminal coupled to the node 417, a second current terminal coupled to the ground terminal 409, a body terminal coupled to the ground terminal 409 and a control terminal coupled to the control terminal of the transistor 444.

Figure 5:
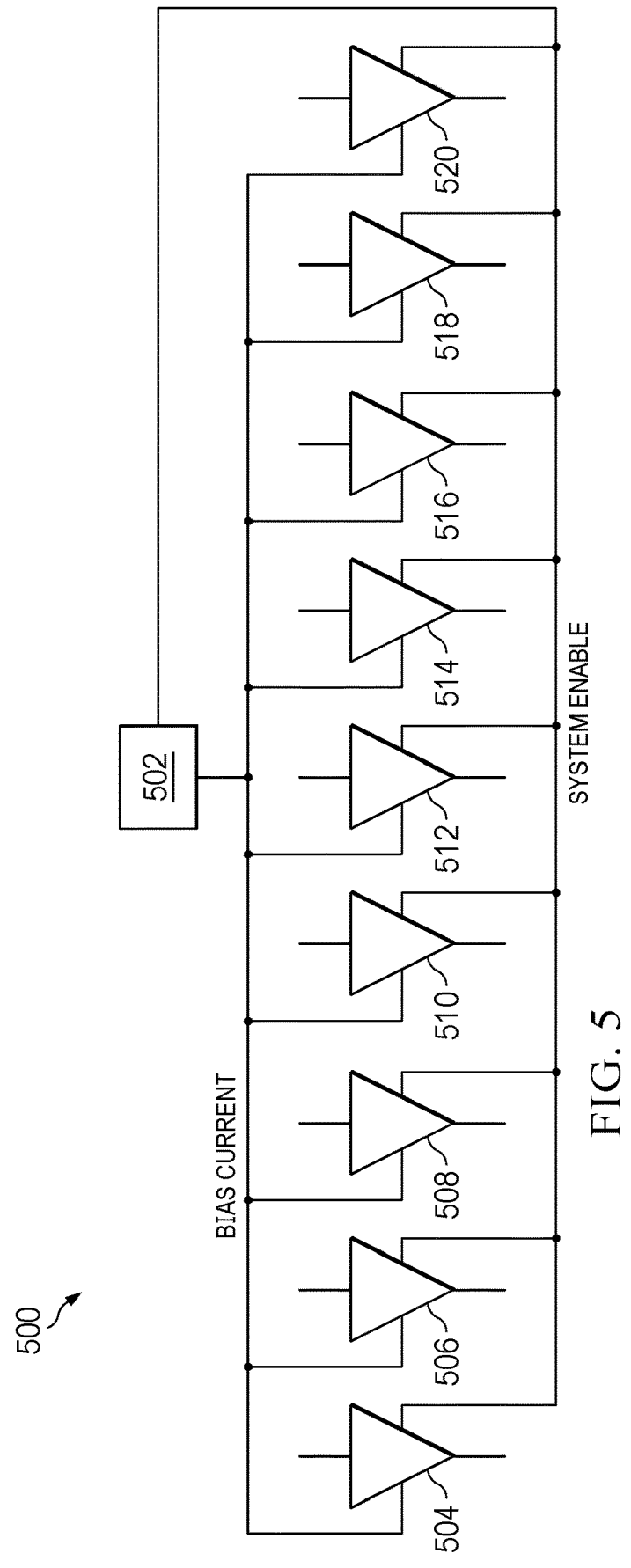
FIG. 5 illustrates an example bias generator and receivers.

FIG. 5 illustrates an example system 500 with one bias generator and nine receivers. The bias generator 502 is coupled to the data receiver 504, to the data receiver 506, to the data receiver 508, to the data receiver 510, to the clock receiver 512, to the data receiver 514, to the data receiver 516, to the data receiver 518, and to the data receiver 520. The bias generator 502 produces a bias current for the receivers 504-520. The bias generator 502 and the receivers 504-520 receive a system enable system from a control circuitry, such as the control circuitry 114 illustrated in FIG. 1A. In an example, the bias generator 502 is an example of the bias generator 110 illustrated in FIG. 1A, and the receivers 504-520 are examples of the receiver 106 illustrated in FIG. 1A. One of the receivers 504-520 is a clock receiver and eight of the receivers 504-520 are data receivers. In an example, power is reduced by using one bias generator with nine receivers.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:
1. A circuit comprising:
a device comprising:
a receiver having a receiver input, a receiver output, an enable input, and a bias current input;

a bias generator having an enable input, and a bias current output coupled to the bias current input;

a buffer having a buffer input, an enable input, and a buffer output, the buffer input coupled to the receiver output; and a delay circuit having an enable input coupled to the enable input of the receiver and to the enable input of the bias generator, and a delay output coupled to the enable input of the buffer.

2. The circuit of claim 1, wherein the delay circuit is configured to:

in response to receiving a system enable signal at the enable input of the delay circuit, produce a buffer enable signal having a first value at the delay output disabling the buffer; and a time period after receiving the system enable signal, produce the buffer enable signal having a second value at the delay output enabling the buffer, the second value different than the first value.

3. The circuit of claim 2, wherein the time period is a first time period and the bias generator is configured to:

in response to receiving the system enable signal at the enable input of the bias generator, ramp up a bias current at the bias current output; and a second time period after receiving the system enable signal, stabilize the bias current at the bias current output.

4. The circuit of claim 3, wherein the delay circuit is configured to:

in response to receiving the system enable signal at the enable input of the delay circuit, produce the buffer enable signal having a first state at the delay output disabling the buffer; and a second time period after receiving the system enable signal, produce the buffer enable signal having a second state at the delay output enabling the buffer, the second state different than the first state.

5. The circuit of claim 4, wherein the second time period is longer than the first time period.

6. The circuit of claim 1, further comprising a transmitter having a transmitter output coupled to the receiver input.

7. The circuit of claim 1, wherein the bias generator comprises:

a current generation circuit;

a time control circuit coupled to the current generation circuit;

a comparator and controller coupled to the time control circuit and to the current generation circuit; and current mirrors coupled to the current generation circuit.

8. The circuit of claim 1, wherein the bias generator comprises:

input differential pairs comprising a quick turn on circuit;

a time control circuit coupled to the input differential pairs; and a voltage divider coupled to the input differential pairs and to the time control circuit.

9. The circuit of claim 1, wherein the bias generator comprises:

a quick turn on circuit;

a capacitor coupled to the quick turn on circuit and to the bias current output; and a time control circuit coupled to the quick turn on circuit.

10. A system comprising:

a controller comprising a transmitter having a transmitter output; and a device coupled to the controller, the device comprising:

a receiver having a receiver input, a bias current input, and a receiver output, the receiver input coupled to the transmitter output; and a bias generator having a bias current output coupled to the bias current input, the bias generator comprising:

a quick turn on circuit;

a capacitor coupled to the quick turn on circuit and to the bias current output; and a time control circuit coupled to the quick turn on circuit, the time control circuit configured to:

in response to receiving a system enable signal, instruct the quick turn on circuit to turn on to charge the capacitor; and in a time period after receiving the system enable signal, instruct the quick turn on circuit to turn off.

11. The system of claim 10, further comprising:

a buffer having a buffer input, an enable input, and a buffer output, the buffer input coupled to the receiver output; and a delay circuit having a delay output coupled to the enable input.

12. The system of claim 11, wherein the time period is a first time period, the delay circuit is configured to implement a timer function, in which the delay circuit is configured to:

in response to receiving the system enable signal, produce a buffer enable signal having a first value at the delay output for a second time period; and in response to the second time period expiring, produce the buffer enable signal having a second value at the delay output, the second value different than the first value.

13. The system of claim 12, wherein the device is a first display device, the system further comprising:

a second display device coupled to the controller; and an application processor coupled to the controller.

14. The system of claim 10, further comprising a transmitter having a transmitter output coupled to the receiver input.

15. The system of claim 10, the bias generator further comprising:

a voltage divider coupled to the quick turn on circuit and to the time control circuit;

current mirrors coupled to the quick turn on circuit; and a resistor coupled to the current mirrors.

16. A circuit comprising:

a buffer having a buffer input, a buffer output, and an enable input; and a delay circuit having a delay output coupled to the enable input, the delay circuit is configured to implement a timer function, in which the delay circuit is configured to:

in response to receiving a system enable signal, produce a buffer enable signal having a first value the delay output; and a time period after receiving the system enable signal, produce the buffer enable signal having a second value at the delay output, the second value different than the first value.

17. The circuit of claim 16, further comprising:

a receiver having a receiver input, a bias current input, and a receiver output, the receiver output coupled to the buffer input; and a bias generator having a bias current output coupled to the bias current input.

18. The circuit of claim 17, wherein the time period is a first time period, the bias generator comprising:

a quick turn on circuit;

a capacitor coupled to the quick turn on circuit and to the
    bias current output; and a time control circuit coupled to the quick turn on circuit,
    the time control circuit configured to:

in response to receiving the system enable signal,
        instruct the quick turn on circuit to turn on to charge
        the capacitor; and a second time period after receiving the system enable
        signal, instruct the quick turn on circuit to turn off.

19. The circuit of claim 18, wherein the first time period
is longer than the second time period.

20. The circuit of claim 17, further comprising a trans-
mitter having a transmitter output, the transmitter output
coupled to the receiver input.

* * * * *